United States Patent [19]
Sani et al.

[11] Patent Number: 5,321,660
[45] Date of Patent: Jun. 14, 1994

[54] STRUCTURE AND METHOD FOR COMPENSATING FOR PROGRAMMING THRESHOLD SHIFT DUE TO NEIGHBOR EFFECT IN AN ARRAY

[75] Inventors: Barmak S. Sani, Palo Alto; Boaz Eitan, Sunnyvale, both of Calif.

[73] Assignee: WaferScale Integration, Inc., Fremont

[21] Appl. No.: 879,407

[22] Filed: May 6, 1992

[51] Int. Cl.⁵ .............................................. G11C 7/00
[52] U.S. Cl. ................................... 365/210; 307/494; 307/530; 365/189.09; 365/189.11
[58] Field of Search ................. 307/491, 494, 530; 365/189.11, 210, 189.09

[56] References Cited

U.S. PATENT DOCUMENTS

| | | | |
|---|---|---|---|
| 4,586,171 | 4/1986 | Fujishima | 365/210 |
| 5,023,839 | 6/1991 | Suzuki et al. | 365/210 |
| 5,148,063 | 9/1992 | Hotta | 307/530 |

*Primary Examiner*—Eugene R. LaRoche
*Assistant Examiner*—Christopher R. Glembocki
*Attorney, Agent, or Firm*—Skjerven, Morrill, MacPherson, Franklin & Friel

[57] ABSTRACT

A structure and method are provided for accurately compensating for the neighbor effect in reading the state of a memory cell in a virtual ground memory array. When the supply voltage Vcc of the memory array increases above a selected maximum value Vccmax, a programmed memory cell reads as an unprogrammed cell. Due to the neighbor effect, a neighboring cell, which was initially unprogrammed during the programming of the memory cell but was subsequently also programmed, causes Vccmax of the memory cell to be lower in a read cycle than in the previous program/verify cycle, resulting in discarding the memory device. In accordance with the present invention, circuitry activated during the read cycle compensates for the neighbor effect by including an unprogrammed replica EPROM transistor identical to the memory cell in parallel with the neighbor of the memory cell being read. This unprogrammed replica EPROM transistor essentially replaces the effect of the actual neighbor memory cell on the memory cell being read and thus ensures that the Vccmax of the memory cell in the read cycle is equal to or greater than the corresponding Vccmax of the memory cell in the program/verify mode.

5 Claims, 8 Drawing Sheets

STRUCTURE AND METHOD FOR COMPENSATING FOR PROGRAMMING THRESHOLD SHIFT DUE TO NEIGHBOR EFFECT IN AN ARRAY

FIELD OF THE INVENTION

This invention relates to erasable programmable read only memories (EPROMs), flash EPROMs, and EEPROMs, and in particular to a method and structure for programming virtual ground EPROMS in such a manner as to compensate for a neighbor effect.

BACKGROUND OF THE INVENTION

Statement of the Problem

In virtual ground arrays, the detected state of a programmed EPROM transistor is affected by the programmed or unprogrammed state of a neighboring EPROM transistor on the same word line.

Virtual Ground EPROM Memory Arrays

A portion of a virtual ground EPROM array is shown in FIG. 1. In FIG. 1 one row r of EPROM transistors Qr,1, Qr,2, Qr,3, Qr,4, Qr,5 ... Qr,c is shown for simplicity. The integer r represents a row and is given by $1 \leq r \leq R$ while the integer c represents a column and is given by $1 \leq c \leq C$, where R and C represent, respectively, the maximum number of rows and columns in the array. Transistor Qr,c is programmed by placing charge on the floating gate FG to increase the turn-on voltage of the corresponding transistor to a selected value, typically 4 or more volts (corresponding, in one convention, to a logical "0"). When the transistor Qr,c is unprogrammed, the threshold voltage of Qr,c is about one volt (corresponding in the same convention to a logical "1"). To read the state of a given transistor, such as EPROM transistor Qr,2, the word line WL is brought to a selected voltage, typically a supply voltage Vcc of 5 volts, thereby applying this supply voltage Vcc to each control gate CG associated with each EPROM transistor Qr,c. A reference voltage Vref of about 3.5 volts is also applied to the gates of NMOS pull-up transistors T1-Tc (which have a threshold voltage Vt of about 1.5 volts). If transistor Qr,2 is programmed (and thereby off), pull-up transistor T3 pulls up bit line BL3 to a voltage given by Vref minus Vt, i.e. to approximately 2.0 volts.

If EPROM transistor Qr,2 is unprogrammed and the word line WL is at the supply voltage Vcc, transistor Qr,2 fully turns on, and a current flows through pull-up transistor T3 and EPROM transistor Qr,2 to virtual ground VG2. Accordingly, bit line BL3 is driven to a voltage level determined by the size and biasing of transistor T3, and the size and biasing of EPROM transistor Qr,2. (The size of a transistor includes its width and length which are, respectively, proportional to and inversely proportional to the strength of the transistor. The biasing of a transistor includes voltages applied to the gate, source, and drain of a transistor.) Typically, the voltage on bit line BL3 is about one volt. If neighboring transistor Qr,3 is unprogrammed, then transistor Qr,3 is also turned on when the voltage on word line WL is at the supply voltage Vcc. Thus, current also flows through pull-up transistor T4 and transistors Qr,3 and Qr,2 to virtual ground VG2. Therefore, the voltage on bit line BL3 is higher when EPROM transistor Qr,3 is unprogrammed than if transistor Qr,3 is programmed because transistors T3 and T4 in parallel provide a stronger pull-up on bit line BL3 than does transistor T3 alone.

To sense the state of EPROM transistor Qr,2, the voltage on bit line BL3 is compared to the voltage on a reference bit line REFBL (FIG. 2) by sense amp 30 (FIG. 3). Referring to FIG. 2, reference EPROM transistor Qref (which is substantially identical to each of the memory transistors Qr,c in row r) is connected between reference bit line REFBL and virtual ground REFVG. Pull-up transistor Q33, connected between voltage source Vcc and reference bit line REFBL, has a channel width 3X which is three times the width X of each of pull-up transistors T1-Tc shown in FIG. 1. Transistor Qref is never programmed, i.e no charge is placed on the floating gate FG of transistor Qref. Thus, transistor Qref has a threshold voltage Vt of about one volt. Consequently, with the voltage on word line WL set to Vcc (approximately 5 volts), the voltage on reference bit line REFBL is then determined by the size and biasing of EPROM transistor Qref to the size and biasing of pull-up transistor Q33. Transistor Qref and Q33 are designed so that the voltage on REFBL is approximately half-way between the voltage on a bit line for the "0" logic state (i.e. transistor Qr,2 programmed) and the "1" logic state (i.e. transistor Qr,2 unprogrammed). Thus typically the voltage on REFBL is approximately 1.5 volts.

Vccmax

As discussed above, if the EPROM transistor being read is unprogrammed, the voltage on its corresponding bit line is lower than the voltage on the reference bit line and is detected by the sense amp as a "1" logic state. If the EPROM transistor being read is programmed, the voltage on its corresponding bit line is higher than the voltage on the reference bit line. This voltage differential is detected by the sense amp as a "0" logic state.

Referring to FIG. 3, if EPROM transistor Qr,2 is programmed to a threshold voltage Vt of approximately 4 volts, then if the voltage on word line WL is greater than 4.0 volts, EPROM transistor Qr,2 will conduct current. With the voltage on word line WL sufficiently above the programmed threshold voltage of EPROM transistor Qr,2, the voltage on bit line BL3 may go below that of reference bit line REFBL. In this case, sense amp 30 would then read transistor Qr,2 as having a "1" logic state (i.e. as being unprogrammed). The voltage supply Vcc on the word line WL at which any programmed EPROM transistor, such as EPROM transistor Qr,2, in the array reads as unprogrammed is defined as Vccmax.

In the case of EPROM transistor Qr,2 unprogrammed, as supply voltage Vcc increases, the voltages on the reference bit line REFBL and bit line BL3 increase linearly as shown by curves 100 and 101 in the graph of FIG. 4. Curve 101 will always remain below curve 100 because pull-up transistor T3, having a channel width of x, provides a weaker pull-up on bit line BL3 than does pull-up transistor Q33, having a channel width of 3x, on reference bit line REFBL.

As mentioned previously, a programmed cell Qr,c typically has a threshold voltage Vt of about 4.0 volts. Thus, if EPROM transistor Qr,2 (FIG. 1) is programmed, the voltage on the word line WL required to turn on EPROM transistor Qr,2 is about 4.0 volts, given that virtual ground VG2 is at ground potential. Referring to curve 102 (Qr,2 programmed) in FIG. 4, as the supply voltage Vcc increases, the voltage on bit line BL3 also initially increases reflecting the increase in the voltage supplied to bit line BL3 through pull-up transistor T3 with no associated pull-down current. However, as the voltage supply Vcc increases above four (4) volts, EPROM transistor Qr,2 turns on and the voltage on bit line BL3 is pulled down toward the voltage on virtual ground VG2. Thus, the plot of the voltage on bit line BL3 versus supply voltage Vcc as shown by curve 102 has a breakpoint at the programmed threshold voltage (i.e. approximately 4.0 volts) of EPROM transistor Qr,2. The slope at which the voltage on bit line BL3 falls, however, varies depending upon whether the neighboring EPROM transistor Qr,3, connected between bit line BL3 and virtual ground VG4 as shown in FIG. 1, is programmed or not programmed.

If the neighboring EPROM transistor Qr,3 is programmed, the voltage on word line WL going above the programmed threshold voltage still fails to turn on EPROM transistor Qr,3 because of two factors. First, the source voltage for EPROM transistor Qr,3 is approximately 2 volts, thereby reducing the effective gate to source voltage across EPROM transistor Qr,3. Second, because of a back bias effect, the effective threshold voltage of EPROM transistor Qr,3 is increased. Note that to turn on transistor Qr,3 under these conditions a voltage of typically 7 volts would be required. Thus, EPROM transistor Qr,3 remains off.

However, if EPROM transistor Qr,3 is not programmed, the threshold voltage of EPROM transistor Qr,3 will be about 1 volt. Consequently, EPROM transistor Qr,3 will fully turn on, and as a result pull-up transistors T3 and T4 will both be coupled in parallel to bit line BL3, thereby providing an effectively stronger pull-up on bit line BL3 than if EPROM transistor Qr,3 is programmed. Thus, the voltage on bit line BL3 will drop faster (i.e. be lower) when EPROM transistor Qr,3 is off (i.e. programmed) than when transistor Qr,3 is on (i.e. not programmed). This is shown by the curve 104 in FIG. 4 labelled "Qr,3 PROGRAMMED" which is below curve 103 labelled "Qr,3 UNPROGRAMMED".

To read a "0" logic state, the voltage on bit line BL3 must be greater than the voltage on reference bit line REFBL. To read a "1" logic state, the voltage on bit line BL3 must be less than the voltage on reference bit line REFBL. The supply voltage Vcc at which the voltage on bit line BL3 equals the voltage on reference bit line REFBL is Vccmax. Referring to FIG. 4, curve 104 (Qr,3 programmed) crosses curve 100 (reference bit line REFBL) at a lower supply voltage Vcc than line 103 (Qr,3 unprogrammed). The voltage difference Δ between the two Vcc levels reflects the "neighbor effect." In FIG. 4, the voltage difference Δ is 0.5 volts. The magnitude of the neighbor effect is a function of process variations between the EPROM transistor and its associated pull-up device, and can be as high as 1.0 to 1.5 volts or as low as 0.2 to 0.5 volts. Because of the neighbor effect, the detected state of a programmed transistor is dependent on the state of a neighboring transistor. A programmed transistor which is detected as being unprogrammed in a final verification (read) cycle results in the whole device being discarded.

To understand how the state of a neighboring transistor affects the detected state of the programmed transistor, the programming of an EPROM memory array must be addressed. Referring to FIG. 5, programming of an EPROM memory array typically comprises two distinct cycles: the program/verify cycle 50 and the read cycle 51. During program/verify cycle 50, an external voltage Vpp on pin 52 is increased to provide a high voltage of approximately 12.75 volts. An individual memory cell is programmed in subcycle 50A by driving a signal $\overline{PGM}$ low on pin 53 for approximately 100 microseconds during which time high voltages are transferred to word line WL and bit line BL. Then, signal $\overline{PGM}$ goes high, thereby ending programming of the memory cell.

After the memory cell is programmed, the level to which the memory cell is programmed is checked in subcycle 50B by providing a low signal $\overline{OE/CE}$ on pin 54. During this verify cycle, the programmed state of the memory cell is verified for a supply voltage Vcc (and a Vccmax) up to about 6.25 volts. If the memory cell is detected to be unprogrammed at a Vcc of 6.25 volts, the memory cell is then reprogrammed via pin 53 until it is detected as programmed at a supply voltage Vcc equal to 6.25 V (this method will be explained in further detail in reference to FIG. 7). After all memory cells have been programmed and verified at the supply voltage of Vcc of 6.25 volts, a final verification is done at the supply voltage Vcc of 5.5 V in read cycle 51 by providing low voltages on pins 52, 53, and 54. In the read cycle 51, any programmed EPROM transistor failing to read as programmed at Vccmax of 5.5 V causes that device to be discarded.

Neighbor Effect

Once programming of the memory has been completed, the neighbor effect causes a lowering of Vccmax for a given transistor below 5.5 V during the read cycle 51, rendering the device defective. Specifically, in the initial stage of the program verify cycle 50, when a specific transistor, for example EPROM transistor Qr,2, is programmed, the neighbor transistor Qr,3 is unprogrammed. Transistor Qr,2 is programmed and verified during cycle 50 until a Vccmax of 6.25 volts is achieved, i.e., following curve 103 in FIG. 4. With the programming and verification of transistor Qr,2 completed, the next memory location is accessed for programming and verification. All memory locations requiring programming are programmed and then verified in this fashion.

After the last memory cell is programmed and verified, a final verify cycle 51 is performed. All programmed cells are accessed and verified for programming at a supply voltage Vcc equal to 5.5 volts. In verifying the Vccmax of EPROM transistor Qr,2 in read cycle 51, if neighbor EPROM transistor Qr,3 was among the cells programmed following the programming of EPROM transistor Qr,2, EPROM transistor Qr,2 would then appear as having a Vccmax lower than the 6.25 volts originally verified in the program/verify cycle 50 (i.e., curve 104 as opposed to curve 103). Typically, this loss in Vccmax is in the range of one to two volts, which sets the Vccmax to below the maximum operating voltage of typically 5.5 V. Therefore, EPROM transistor Qr,2 will be considered defective, resulting in a "failed" device.

Assuming that EPROM transistor Qr,3 was not programmed during program/verify cycle 50, EPROM transistor Qr,2 will have a Vccmax higher than 6.25 V and the device will pass.

However, if any two adjacent EPROM transistors in the entire array are eventually both programmed, i.e., the neighbor device being originally unprogrammed and subsequently programmed during the program/- verify cycle 50, the product still fails during the final read cycle 51. Because there is a high probability of this configuration occurring (i.e. two adjacent cells being programmed), without a solution to the above-described problem, virtual ground arrays would typically not yield any functional products.

Prior Art Solution to Neighbor Effect

To solve the problem introduced by the neighbor effect, prior art circuitry 31 is coupled to sense amp 30 as shown in FIG. 3. In FIG. 3, pull-up transistor Q33 is connected to the voltage supply Vcc and the reference bit line REFBL. As noted previously, transistor Q33 has a channel width three times that of each of pull-up transistors T1 through Tc shown in FIG. 1.

The array bit line, for example bit line BL3, is attached to the non-inverting input lead of sense amp 30. Connected to array bit line BL3 are two pull-up transistors Q34 and Q35. Specifically, pull-up transistor T3 (FIG. 1) comprises transistors Q34 and Q35. Each pull-up transistor Q34 and Q35 has one-half the channel width associated with the pull-up transistors T1 through Tc in FIG. 1. Thus, transistors Q34 and Q35 each have a channel width x/2. Transistor Q36 provides the means to enable or disable pull-up transistor Q35, depending on the state of the signal $\overline{SAVPP}$, a signal generated from external voltage Vpp.

During the program/verify cycle 50 (FIG. 5), voltage SAVPP is high. Thus, $\overline{SAVPP}$ is low, thereby turning off transistor Q36 in FIG. 3 and disabling pull-up transistor Q35. Therefore, only pull-up transistor Q34 is on during the verify subcycle 50B.

In this manner, to achieve the desired Vccmax of 6.25 volts, EPROM transistor Qr,2 must program to a higher threshold voltage (for example 4.5 volts) to compensate for pull-up transistor Q34 (i.e. curve 105 in FIG. 4). If neighboring EPROM transistor Qr,3 was unprogrammed during the programming and verifying of EPROM transistor Qr,2 in cycle 50, but later programmed, EPROM transistor Qr,2 has a Vccmax higher than 6.25 V during the read cycle 51. This increase in Vccmax is a result of enabling transistor Q36 and turning on pull-up transistor Q35, thereby more than compensating for the loss in Vccmax (previously mentioned) due to the neighbor effect. On the other hand, if neighbor transistor Qr,3 was never programmed, Vccmax would be raised to even greater than the previous voltage of 6.25 volts by enabling transistor Q36. Thus, in either case, EPROM transistor Qr,2 will have a Vccmax of higher than 6.25 volts.

For the above solution to always work, the size of transistor Q34 has to be designed such that the worst case reduction in Vccmax due to the neighbor effect is always compensated. The N-channel transistor Q34 needs to compensate for the worst case EPROM array cell (i.e., a cell which is slow to program). Thus, the process overcompensates for the neighbor effect of a typical EPROM cell which has an average programming time less than the worst case programming time.

Therefore, using circuitry 31 of FIG. 3 frequently results in unnecessary overprogramming of EPROM transistors in the memory array. This overprogramming increases programming time when the EPROM cell programming is slow, and also reduces yield because some EPROM cells to be programmed cannot program to the overcompensated level within the programming time limit.

Therefore, a need arises for a structure and method of accurately compensating for the neighbor effect during the reading of a memory cell to ensure that the desired Vccmax is achieved without overprogramming each memory cell.

SUMMARY OF THE INVENTION

In accordance with the present invention, a structure and a method are provided which accurately compensate for the state of a neighboring cell in a memory array, thereby ensuring that a voltage Vccmax (i.e. the voltage at which a programmed memory cell reads as an unprogrammed cell) for each memory cell in the array is the same or slightly higher in a read mode of the array as it is in a program/verify mode. An individual memory cell in an array is programmed, verified, and read using a sense amplifier coupled to both the array bit line associated with the array memory cell and a reference bit line associated with a reference memory cell. To ensure an acceptable minimum voltage Vccmax of an EPROM memory cell regardless of the state of the neighbor memory cell, an unprogrammed replica EPROM cell is coupled to the sense amplifier and the array bit line in series with a replica pull-up device and a switching device. In one embodiment, the replica pull-up device and the switching device are N-channel transistors. The unprogrammed replica EPROM cell imitates the neighboring cell in the array and thus the state of the neighboring cell (i.e. whether the neighboring cell is programmed or unprogrammed) becomes irrelevant to the determination of the state of the cell being read. The replica pull-up device imitates the associated pull-up device of the neighboring memory cell. The switching device provides means for enabling the replica EPROM cell and its associated pull-up device in accordance with the present invention. During the programming/verifying mode, the replica EPROM cell (which is always unprogrammed) and the associated replica pull-up device are deactivated by shutting off the N-channel switching transistor. During the read mode, the replica EPROM cell and the replica pull-up device are activated by turning on the N-channel switching device. Thus, the effect of a programmed neighbor memory cell on the memory cell being read is accurately compensated for by replacing the effect of the programmed neighboring cell with the effect of the unprogrammed replica memory cell. This replacement results in a slightly higher Vccmax in the read cycle than during the program/verify cycle. If the neighboring cell is in fact unprogrammed, then the Vccmax is identical in each cycle. Accordingly, the Vccmax of the memory cell is guaranteed to be the same or slightly higher in the read cycle of the array relative to the program/verify cycle.

One advantage of the invention is that the unprogrammed replica EPROM cell is fabricated using the same process and at the same time as each of the memory cells in the array. Accordingly, any variations in each memory cell due to processing variations are accurately reflected in the unprogrammed replica EPROM cell. That is, the process used to fabricate the replica EPROM cell accurately tracks (i.e. is the same as) the process used to fabricate each memory cell in the array. Process tracking minimizes the overprogramming of the memory cells in compensating for the neighbor effect. By minimizing the overprogramming, the total time required to program is reduced, thereby speeding up the programming time. Also, because overprogramming frequently results in "defective" devices which fail to attain the proper threshold value within the programming time allowed, the present invention, by minimizing this overprogramming, provides increased yield.

DETAILED DESCRIPTION

Figure 6:
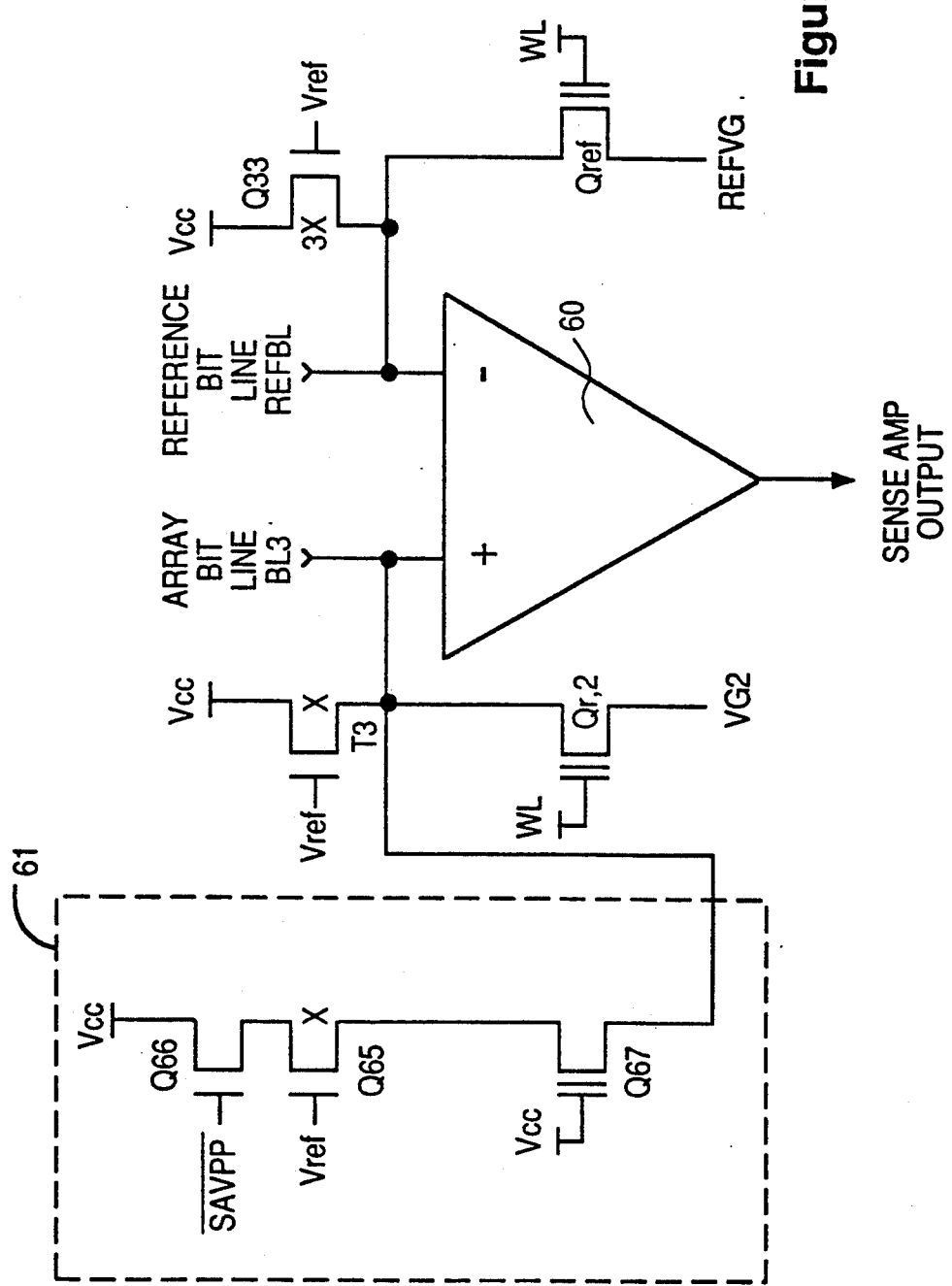
FIG. 6 illustrates the sense amp circuit configuration in accordance with the present invention to accurately compensate for the "neighbor effect".

FIG. 6 illustrates a structure in accordance with the present invention which compensates for the neighbor effect on the state of a memory cell. In FIG. 6, sense amplifier 60 has a reference bit line REFBL connected to its negative input lead. Pull-up transistor Q33 is connected to a voltage source Vcc and the reference bit line REFBL. Transistor Q33 in one embodiment has a channel width three times that of pull-up transistor T3 although other appropriate channel widths might also be used.

Each bit line of the array, shown as bit line BL3 in FIG. 6, is capable of being attached to the non-inverting input lead of sense amp 60. Connected to the array bit line BL3 are pull-up transistor Q65, switching device Q66, and unprogrammed replica EPROM Q67. Pull-up transistor Q65 has the same channel width as each of pull-up transistors T1 through Tc in FIG. 1. Thus, transistor Q65 has a channel width X.

In accordance with the present invention, circuitry 61 is coupled to sense amp 60 as shown in FIG. 6. In FIG. 6, an unprogrammed replica EPROM cell 67 is coupled to the non-inverting input lead of sense amplifier 60 and the array bit line BL3 in series with pull-up device 65 and switching device 66. In the embodiment illustrated in FIG. 6, the pull-up device Q65 and switching device Q66 are N-channel transistors. As noted previously, transistor Q33 has a channel width three times that of pull-up transistor T3.

During the program/verify mode 50 (FIG. 5) for EPROM transistor Qr,2, voltage SAVPP is high. Thus, $\overline{SAVPP}$ is low, thereby turning off switching device Q66 and disabling pull-up device Q65 and replica EPROM cell Q67. Note that pull-up transistor T3 and memory cell Qr,2 are shown in FIG. 6 for clarity. Therefore, during the verify subcycle 50B, only pull-up transistor T3 is on (with reference voltage Vref about 3.5 volts).

During the read cycle 51 (FIG. 5), voltage SAVPP is low. Thus, $\overline{SAVPP}$ is high, thereby switching on switching device Q66. This allows current to flow through pull-up transistor Q65 and replica EPROM cell Q67. Thus, circuitry 61 provides an additional pull-up on bit line BL3 to compensate for a worst case condition in which transistor Qr,3 is detected as programmed in the read cycle and unprogrammed in the verify cycle.

The table below summarizes the possible conditions of neighbor Qr,3 in relation to verify subcycle 50B and read cycle 51. The difference between the Vccmax in the read mode 51 and the Vccmax of the verify subcycle 50B is a difference delta. The delta in the case of neighbor cell Qr,3 being on in the verify subcycle (50B) and being on in the read cycle (51) is greater than zero volts. Similarly, when neighbor transistor Qr,3 is off in the verify subcycle (50B) and off in the read cycle (51), circuitry 61 provides a delta greater than zero volts. Finally, if neighbor transistor Qr,3 is on in the verify subcycle (50B) and off during the read cycle (51), circuitry 61 provides a delta equal to zero volts. As seen above, circuitry 61 in accordance with the present invention provides an accurate compensation for the neighbor effect by ensuring that the Vccmax in the read cycle 51 is equal to or greater than the Vccmax of the program/verify cycle.

|  | (50B) Verify | (51) Read | Read Δ=Vccmax (51) | Verify - Vccmax (50B) |
|---|---|---|---|---|
| Neighbor Qr,3 | ON | ON | >zero |  |
|  | ON | OFF | =zero |  |
|  | OFF | OFF | >zero |  |

One advantage of the invention is that unprogrammed replica transistor Q67, switched into the circuit during the read mode of transistor Qr,2, is fabricated using the same process and at the same time as each of the memory cell transistors Qr,c in the memory array. Accordingly, any variations in Qr,c due to fabrication are accurately reflected in replica transistor Q67. That is, transistor Q67 accurately tracks the process used to fabricate each memory cell transistor Qr,c. Consequently, the Vccmax of the circuit is always accurately met because the unprogrammed replica EPROM transistor Q67 accurately matches all process variations and thus the characteristics of each of the EPROM transistors Qr,c and is switched into the circuit during the reading of each memory cell to effectively replace the neighboring cell.

Process tracking minimizes the overprogramming of the memory cells in compensating for the neighbor effect by providing the exact voltage pull-up on bit line BL3 that the neighboring cell would provide if it were unprogrammed. By minimizing the overprogramming, the total programming required is reduced, thereby speeding up the programming time. Also, because overprogramming for a slow to program EPROM results in devices which fail to attain the proper threshold value within the programming time, the present invention, by minimizing this overprogramming, provides increased yield.

Using an NMOS transistor to compensate for a neighbor effect as taught in prior art results in excess overprogramming because the worst case process variations of the EPROM cell need to be accounted for at all times. In contrast, using an EPROM cell to replicate the neighboring cell in accordance with this invention provides the exact delta Vccmax needed to compensate for the neighbor effect.

Figure 7:
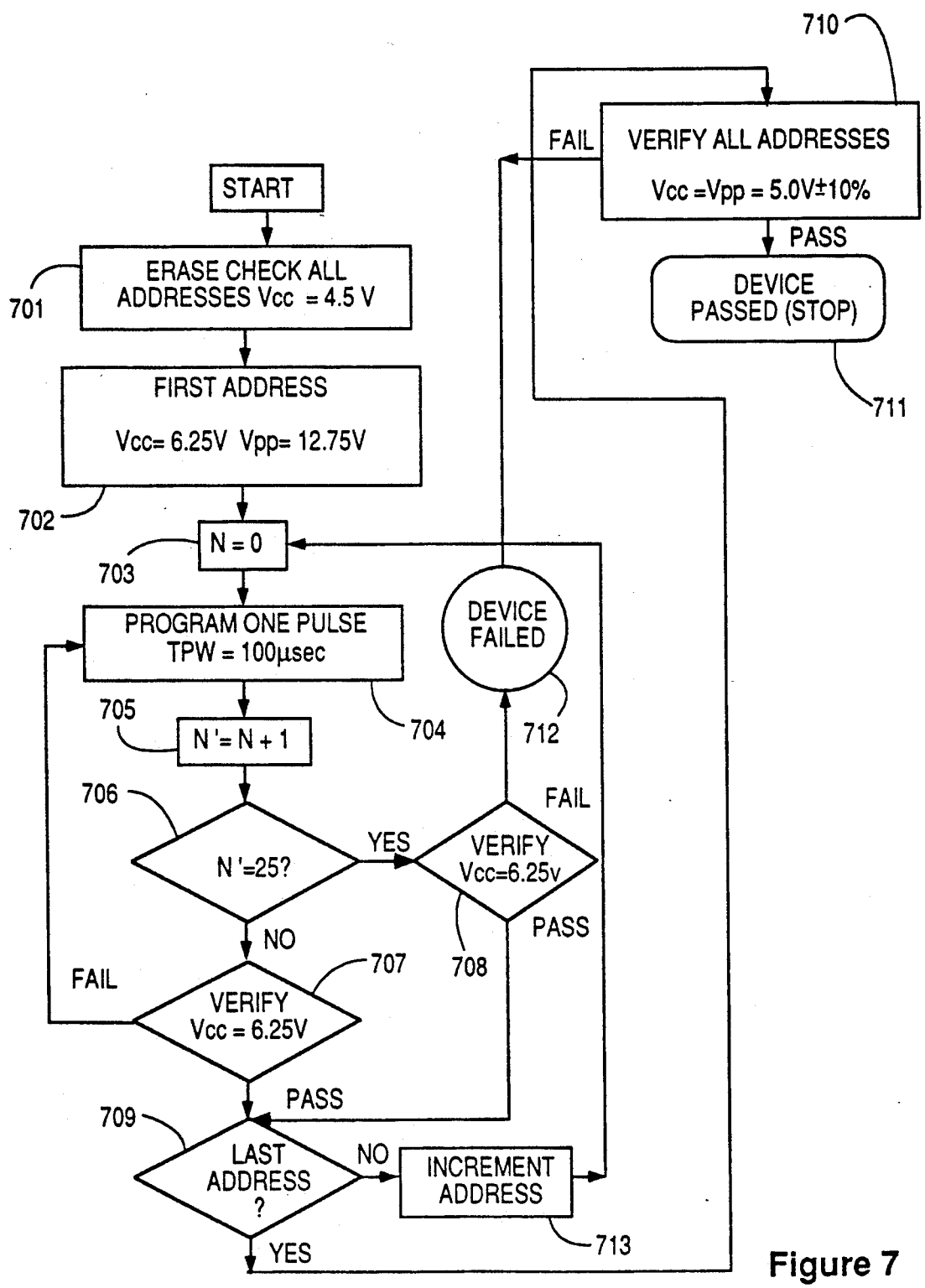
FIG. 7 shows a typical programming method used in accordance with this invention and with the prior art.

FIG. 7 illustrates the programming algorithm used in accordance with this invention to program each cell in the array which is to be programmed. In step 701, each memory cell is accessed through its corresponding address and is checked to verify that each EPROM transistor is unprogrammed (erased) down to a supply voltage Vcc equal to 4.5 Volts. (The threshold voltage Vt is 1 volt when a transistor Qr,c is not programmed. Thus, if an EPROM transistor does not verify as being unprogrammed for a supply voltage Vcc equal to 4.5 volts, the whole device must be fully erased, typically by exposure to UV light).

In step 702, the first EPROM transistor is accessed through its corresponding address and a voltage VPP of 12.75 Volts is applied to the device. In step 703, N (the number of trials to program the transistor) is set to 0 indicate a first pass is being made, i.e. N=0. Following the programming of this EPROM transistor (which takes about 100 μsec) in step 704, the number of trials N is increased by one to N' in step 705. Step 705 corresponds to the subcycle 50A of FIG. 5. Step 706 checks whether N' is equal to 25. If not, the Vccmax of the programmed EPROM transistor is then verified in step 707 at a supply voltage Vcc equal to 6.25 volts. Note step 707 corresponds to verify subcycle 50B of FIG. 5.

If the programmed EPROM transistor appears unprogrammed at Vcc equal to 6.25 volts and with N, not equal to 25, the device is then reprogrammed and reverified as in steps 704–707. Note that during each programming cycle, the N' of the previous cycle becomes the new N in step 705. Steps 704–707 are repeated until either the EPROM transistor is programmed and verified at a supply voltage Vcc equal to 6.25 volts, or a total of 2.5 milliseconds of programming is completed.

If the EPROM transistor does not program correctly after twenty-five tries in step 708, i.e. 2.5 milliseconds, the device is considered to be defective in step 712 and is discarded. If the transistor programs in less than or equal to 25 tries, the program checks to see if the last address has been reached in step 704. If not, the address is incremented as required in step 713 to reach the next address of an EPROM transistor to be programmed and to reset N in step 703 to zero.

This procedure is repeated until the last address to be programmed is reached. Then, the Vccmax of each and every programmed EPROM is verified once again in step 710 at a supply voltage Vcc equal to 5.5 volts. Step 710 corresponds to the read mode 51 shown in FIG. 5. The circuit passes if all devices as programmed produce the correct readout from sense amp 60 (FIG. 6). If the circuit fails, it is discarded in step 712. If the circuit passes, the program stops in step 711.

Figure 3:
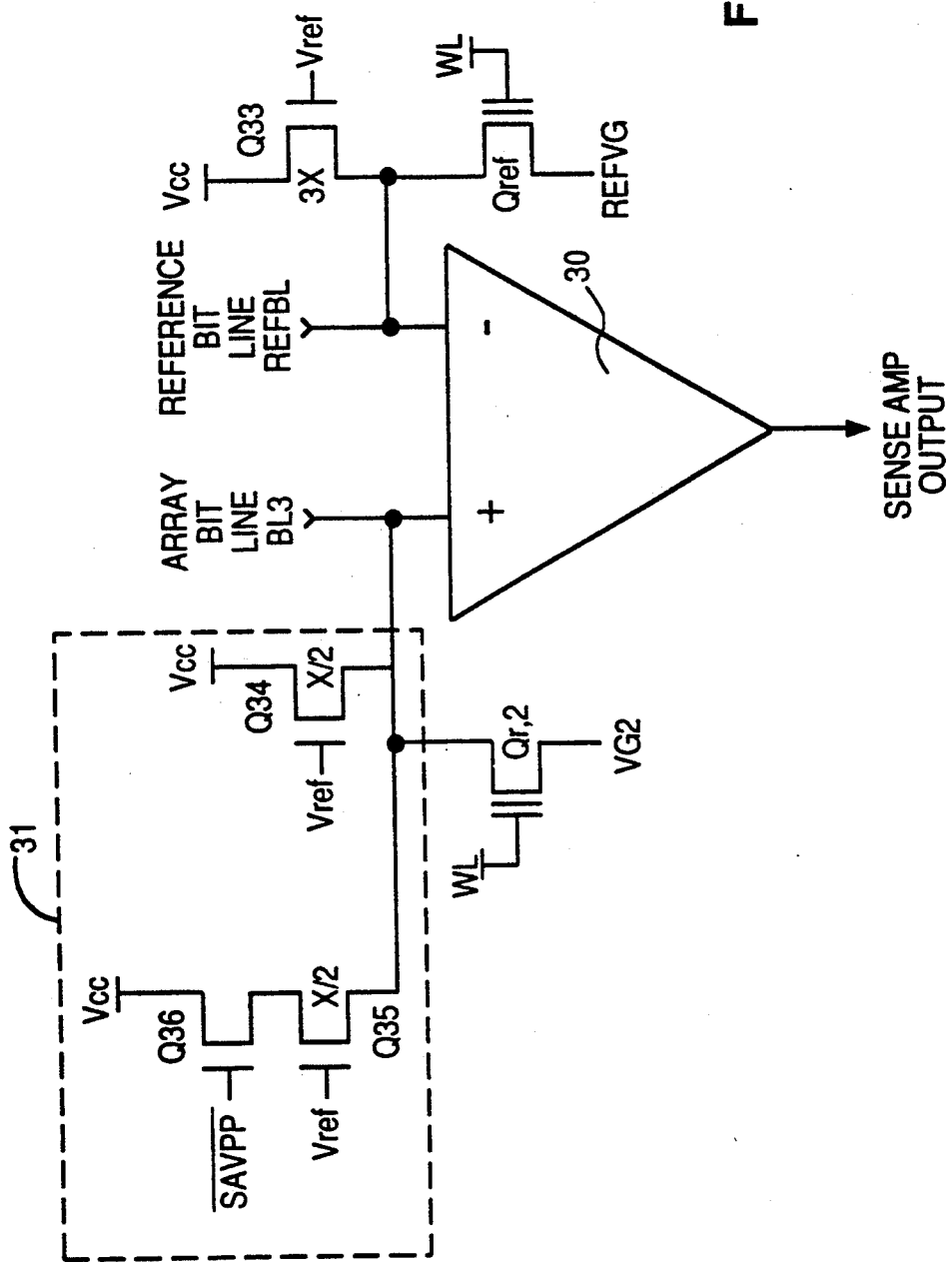
FIG. 3 illustrates schematically a prior art sense amplifier, the reference bit line REFBL, and the array bit line BL3.
Figure 4:
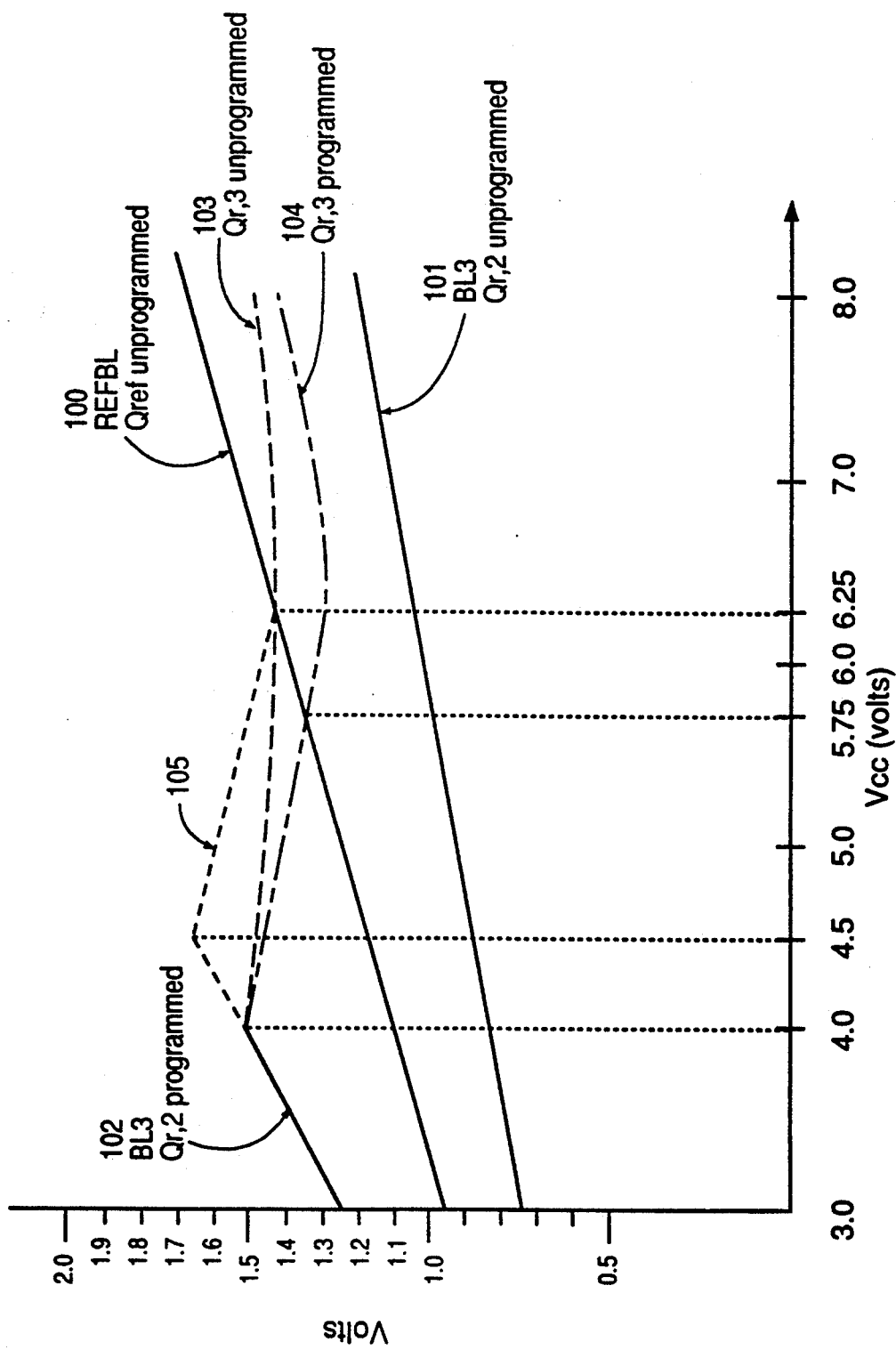
FIG. 4 is a graph of the voltages on bit line BL3, for memory cell Qr,2 programmed and unprogrammed, and on reference bit line REFBL in the array of FIGS. 1 and 2 as a function of the supply voltage Vcc on the word line WL.
Figure 5:
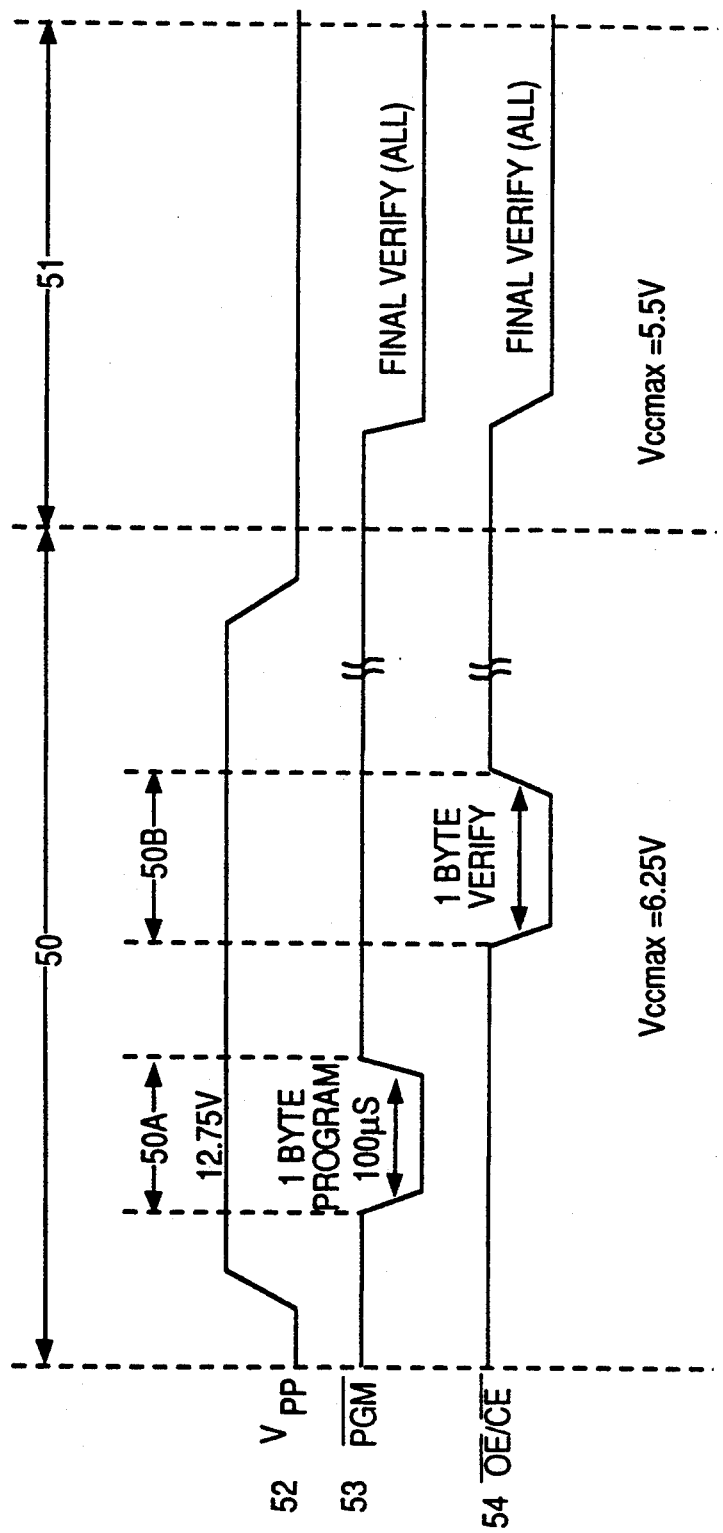
FIG. 5 compares three signals during the program/verify mode and the read mode.

Using the prior art circuitry, shown in FIG. 3, due to excess programming time required, the above described algorithm would at times result in failure of the devices at step 707, i.e. at the verify subcycle 50B of FIG. 5. Specifically, some EPROM cells to be programmed cannot program to the overcompensated level within the programming time limit of 2.5 milliseconds. In accordance with the present invention, because of the inclusion of a replica unprogrammed EPROM transistor in the circuitry, minimum overprogramming is required to compensate for the neighbor effect, therefore reducing the failure rate associated with step 707. Thus, the present invention provides increased yield.

Figure 8:
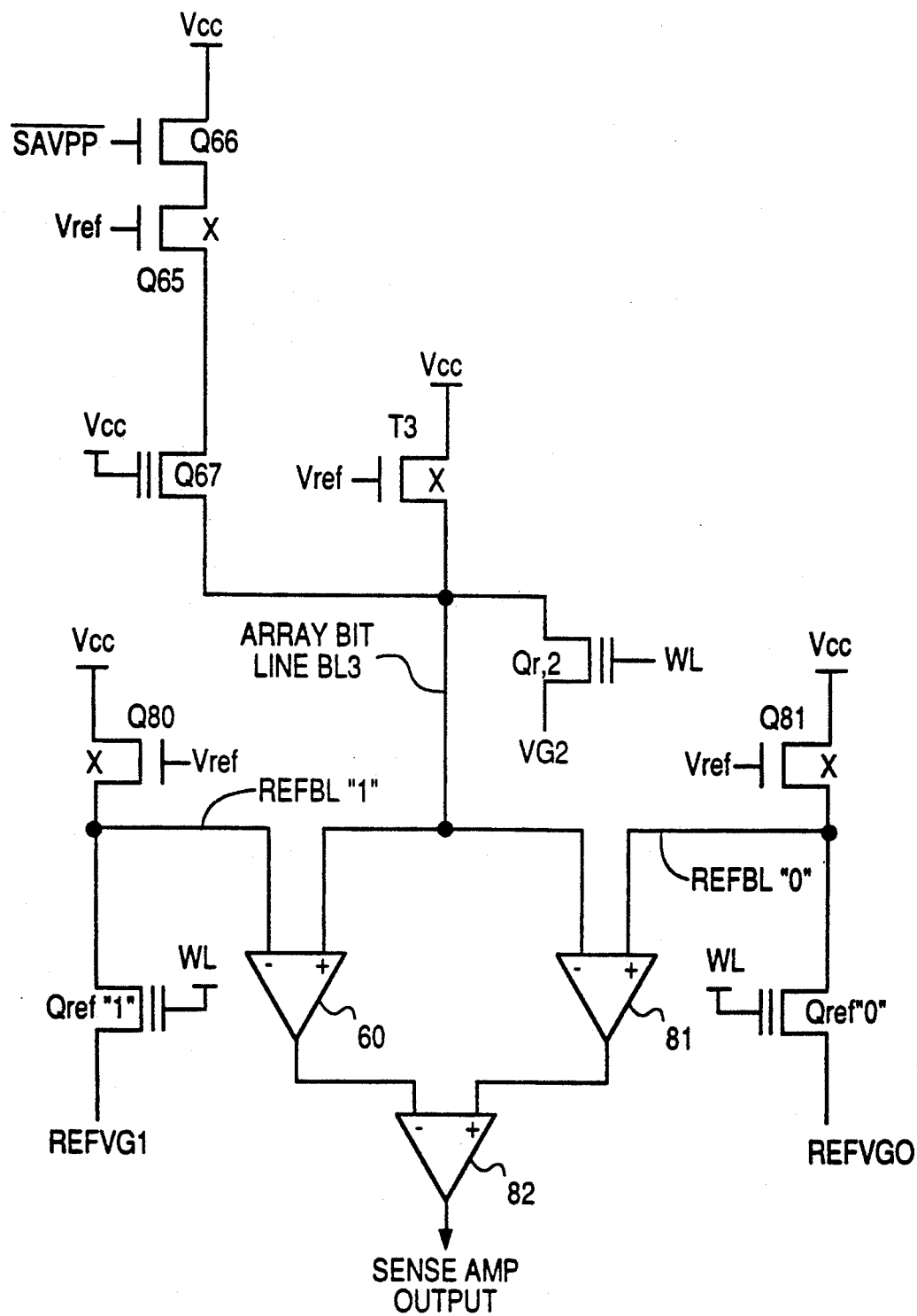
FIG. 8 shows the application of the present invention in a dual-reference sensing scheme.

FIG. 8 shows the application of this invention in another sensing scheme in which two reference bit lines are provided (hence the name dual reference sensing). Reference bit line REFBL"1" is connected to an EPROM transistor Qref "1" which is always unprogrammed and a pullup transistor Q80, while reference bit line REFBL "0" is connected to an EPROM transistor Qref "0", which is programmed to be always non-conductive, and a pullup transistor Q81.

Figure 1:
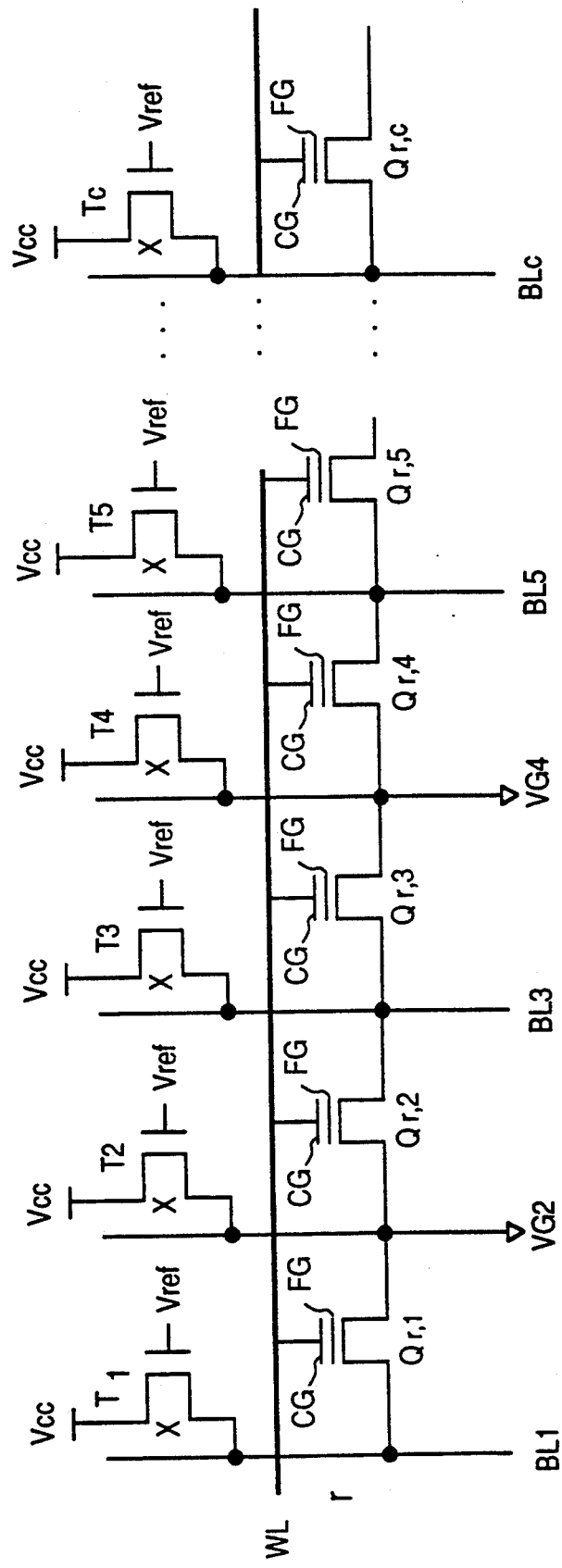
FIG. 1 illustrates a portion of an EPROM memory array showing the relationship of the bit lines BL, virtual grounds VG, and memory transistors Qr,c to the word line WL and the pull-up transistors T1, T2 ... Tc.
Figure 2:
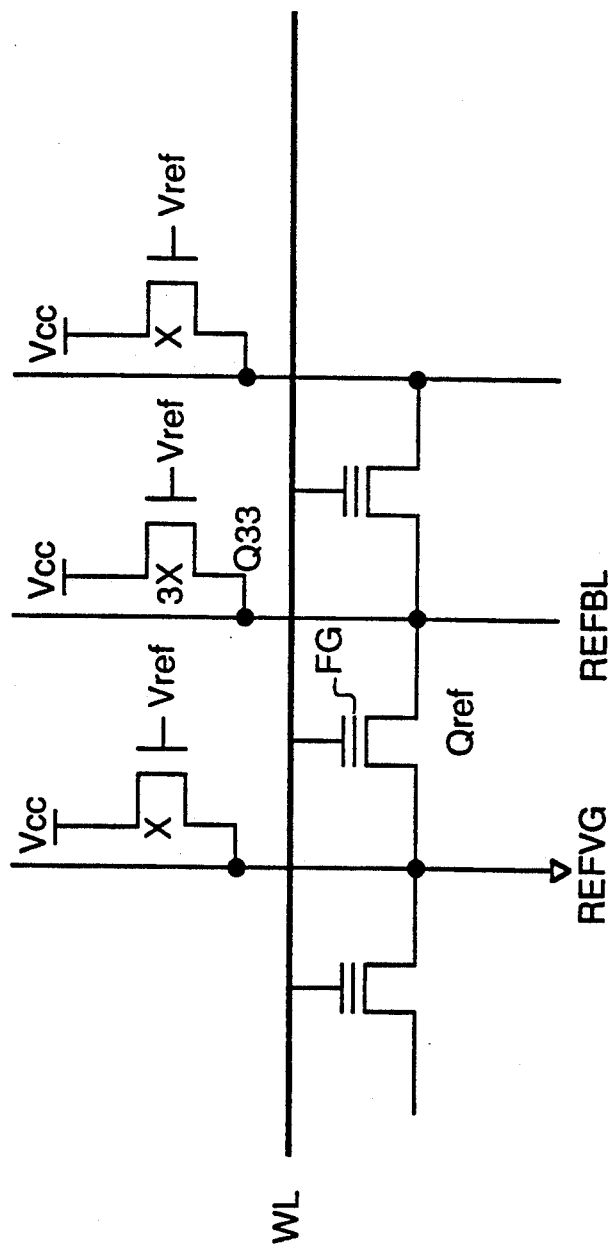
FIG. 2 shows the relationship of the reference bit line REFBL, the reference transistor Qref and the reference pull-up transistor Q33 to a reference virtual ground.

The two reference pullup transistors Q80 and Q81 are identical to the pullup transistors in the array illustrated in FIG. 1, i.e. T1-Tc. The two sense amps 60 and 81 connected as shown in FIG. 8 function such that if the signal generated by bit line BL3 and reference bit line REFBL "0" across sense amp 81 is numerically smaller than the signal generated by bit line BL3 and reference bit line REFBL "1" across sense amp 60, then the output will be a logical "0" level corresponding to a programmed state. The opposite signal condition would then correspond to a logical "1" level.

For example, the voltage on reference bit line REFBL "0" is typically two volts because EPROM transistor Qref "0" is always off (non-conductive), and the voltage on reference bit line REFBL "1" is typically one volt because EPROM transistor Qref "1" is always on (unprogrammed), thereby pulling down the voltage on reference bit line REFBL "1" to reference virtual ground REFVG 1. Thus, irrespective of the voltage on bit line BL3, the voltage on reference bit line REFBL "0" is greater than the voltage on reference bit line REFBL "1". The voltage on bit line BL3 is approximately one volt if EPROM transistor Qr,2 is unprogrammed and is approximately two volts if EPROM transistor Qr,2 is programmed.

If EPROM transistor Qr,2 is unprogrammed, sense amp 81 will amplify the voltage difference (of 1 volt) between reference bit line REFBL "0" and bit line BL3. Sense amp 60, however, will not amplify because of a zero voltage difference between reference bit line REFBL "1" and bit line BL3. If EPROM transistor Qr,2 is programmed, sense amp 81 will not amplify its input signal because of a zero voltage difference between reference bit line REFBL "0" and bit line BL3. Sense amp 60 will amplify the voltage difference (of 1 volt) between reference bit line REFBL "1" and bit line BL3.

Because the output signals from sense amps 60 and 81 depend on the programmed or unprogrammed state of EPROM transistor Qr,2, the output signal of sense amp 82 (responding to the voltage difference between those output signals) will also depend on this state. The Vccmax for the dual reference scheme is defined as the supply voltage Vcc at which the signal across sense amp 81 is greater than that across sense amp 60, resulting in a programmed EPROM transistor to read as unprogrammed. The neighbor effect affects the detected state of a programmed EPROM transistor in the same manner as in the case of the single reference scheme described in detail above. Depending on the state of the neighbor transistor, the Vccmax can be lowered in the same manner as that of the single reference scheme. Thus, the Vccmax reduction due to neighbor effect in a dual reference scheme can be compensated for in exactly the same way as in the single reference scheme.

The above description of the present invention is meant to be illustrative only and not limiting. Other embodiments of a structure and method of compensating for the neighbor effect will be obvious to those skilled in the art.

We claim:

1. A memory array comprising:
    a memory cell connected to a bit line;
    a neighboring memory cell connected to said bit line;
    an unprogrammed replica memory cell connectable to said bit line;
    means for connecting said unprogrammed replica memory cell between a supply voltage and said bit line to effectively replace the effect of said neighboring memory cell during a reading of said memory cell with the effect of said unprogrammed replica memory cell;
    a first pull-up device associated with said neighboring memory cell; and
    a second pull-up device connected in series with said unprogrammed replica memory cell,
    wherein said second pull-up device replicates the effect of said first pull-up device during a read of said memory cell.

2. The memory array of claim 1 further comprising:
    a switching device connected in series with said second pull-up device;
    wherein said switching device is switched on during said read of said memory cell.

3. The memory array of claim 2 wherein said memory cell, said neighboring memory cell, and said unprogrammed replica memory cell are EPROM transistors.

4. The memory array of claim 3 wherein said first and said second pull-up devices are N-channel transistors.

5. The memory array of claim 4 wherein said switching device is an N-channel transistor having a size and biasing much larger than that of said second pull-up device.

* * * * *